United States Patent
Hori et al.

(10) Patent No.: US 8,507,935 B2
(45) Date of Patent: Aug. 13, 2013

(54) LIGHT EMITTING ELEMENT AND LIGHT EMITTING DEVICE

(75) Inventors: Atsuhiro Hori, Kagoshima (JP); Hidenori Kamei, Kagoshima (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/388,612

(22) PCT Filed: Jul. 27, 2010

(86) PCT No.: PCT/JP2010/004769
§ 371 (c)(1),
(2), (4) Date: Feb. 2, 2012

(87) PCT Pub. No.: WO2011/016201
PCT Pub. Date: Feb. 10, 2011

(65) Prior Publication Data
US 2012/0126276 A1 May 24, 2012

(30) Foreign Application Priority Data

Aug. 6, 2009 (JP) ................................. 2009-183011

(51) Int. Cl.
*H01L 33/36* (2010.01)

(52) U.S. Cl.
USPC .. 257/98; 257/99; 257/E33.068; 257/E33.067

(58) Field of Classification Search
USPC ................ 257/79, 98, 99, E33.068, E33.064, 257/E33.067, E33.074, E33.072
See application file for complete search history.

(56) References Cited

U.S. PATENT DOCUMENTS

| 2004/0012958 A1 | 1/2004 | Hashimoto et al. |
| 2005/0062060 A1 | 3/2005 | Nagai et al. |
| 2005/0121688 A1* | 6/2005 | Nagai et al. ...................... 257/99 |
| 2005/0211989 A1* | 9/2005 | Horio et al. ...................... 257/79 |
| 2008/0210959 A1 | 9/2008 | Nagai et al. |

FOREIGN PATENT DOCUMENTS

| JP | 11-340514 | 12/1999 |
| JP | 2002-319705 | 10/2002 |
| JP | 2005-051233 | 2/2005 |
| JP | 2005-210053 | 8/2005 |
| JP | 2006-261392 | 9/2006 |
| JP | 2007-180234 | 7/2007 |
| JP | 2008-205229 | 9/2008 |

OTHER PUBLICATIONS

Translation of JP11340514.*
Translation of JP2008205229.*
International Search Report issued in International Patent Application No. PCT/JP2010/004769 dated Aug. 24, 2010.

* cited by examiner

*Primary Examiner* — Victor A Mandala
*Assistant Examiner* — Whitney T Moore
(74) *Attorney, Agent, or Firm* — McDermott Will & Emery LLP

(57) ABSTRACT

A light emitting element and a light emitting device for which light extraction efficiency is enhanced are provided.

A light emitting element 10 includes a substrate 1 having light transmittance, a semiconductor layer 2 in which an n-type layer 2a, an active layer 2b, and a p-type layer 2c are stacked, a reflective electrode 3 stacked on the semiconductor layer 2 and configured to reflect light emitted from the active layer 2b, toward the substrate 1, a p-side pad electrode 4 stacked on the reflective electrode 3, an insulating film 6 covering a side surface of the semiconductor layer 2 and having light transmittance, a reflective film 7 stacked on the insulating film 6 and having light reflectivity, and an n-side electrode 5 provided on the substrate 1.

12 Claims, 8 Drawing Sheets

LIGHT EMITTING ELEMENT AND LIGHT EMITTING DEVICE

RELATED APPLICATIONS

This application is the U.S. National Phase under 35 U.S.C. §371 of International Application No. PCT/JP2010/004769, filed on Jul. 27, 2010, which in turn claims the benefit of Japanese Application No. 2009-183011, filed on Aug. 6, 2009, the disclosures of which Applications are incorporated by reference herein.

TECHNICAL FIELD

The present invention relates to a flip-chip light emitting element in which a semiconductor layer including an n-type layer, an active layer, and a p-type layer is stacked on a substrate, and to a light emitting device.

BACKGROUND ART

As a flip-chip light emitting element, a light emitting element described in Patent Document 1 has been known. The flip-chip light emitting element described in Patent Document 1 includes positive and negative electrodes provided on the same side as a side on which nitride semiconductor layers formed on a light-transmissive insulating substrate are provided, and a protective film covering part of surfaces of the nitride semiconductor layers other than exposure portions of electrode surfaces. In addition, the protective film has a triple-layer structure of a first layer which is an insulating covering film, a metal layer provided on the first layer, and a second layer which is an insulating covering film provided on the metal layer.

As one example of a configuration in which the metal layer reflects light transmitting through the first layer to enhance light harvesting and light extraction efficiency, Patent Document 1 describes a configuration in which the metal layer serves as part of the electrodes. Such a configuration allows simultaneous formation of the electrodes and the metal layer.

CITATION LIST

Patent Document

PATENT DOCUMENT 1: Japanese Patent Publication No. H11-340514

SUMMARY OF THE INVENTION

Technical Problem

In the flip-chip light emitting element described in Patent Document 1, the entirety of the active layer is covered by the metal layer, thereby enhancing the light extraction efficiency. However, a light emitting element having higher light extraction efficiency is desired.

Thus, it is an objective of the present invention to provide a light emitting element having higher light extraction efficiency, and a light emitting device.

Solution to the Problem

A light emitting element of the present invention includes a substrate having light transmittance; a semiconductor layer in which an n-type layer, an active layer, and a p-type layer are stacked on the substrate; a reflective electrode stacked on the semiconductor layer and configured to reflect light emitted from the active layer, toward the substrate; a p-side pad electrode stacked on the reflective electrode; an insulating film covering a side surface of the semiconductor layer and having light transmittance; and a reflective film stacked on the insulating film and having light reflectivity.

Advantages of the Invention

In the present invention, the reflective layer can reflect light emitted from the active layer toward the side surface of the semiconductor layer and light returned after being reflected by a back surface of the substrate, back toward the substrate, and the reflective electrode can reflect light emitted from the active layer in a direction opposite to a direction toward the substrate, toward the substrate. Thus, light extraction efficiency can be further improved.

DESCRIPTION OF EMBODIMENTS

Figure 1:
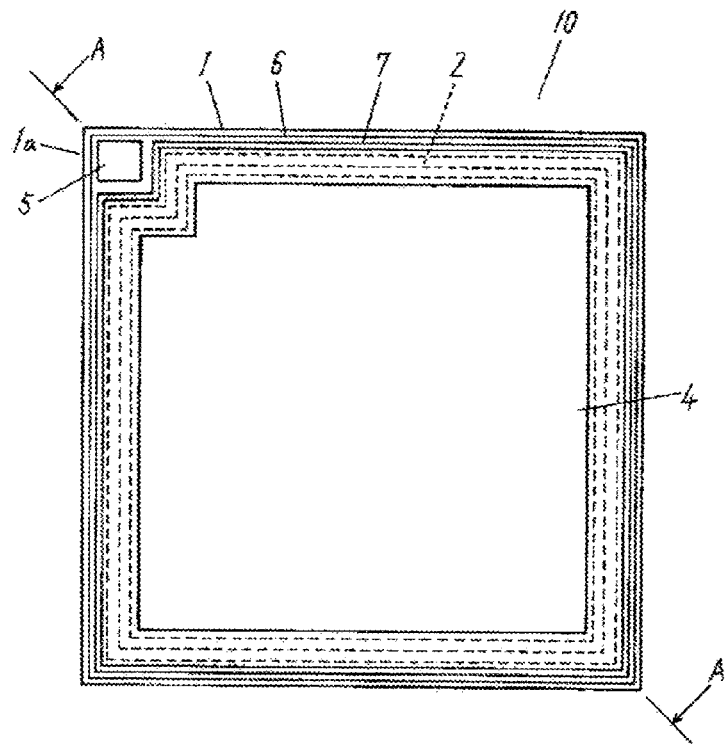
FIG. 1 is a plan view illustrating a light emitting element of a first embodiment of the present invention.

A first preferred embodiment is directed to a light emitting element of the present invention including a substrate having light transmittance; a semiconductor layer in which an n-type layer, an active layer, and a p-type layer are stacked on the substrate; a reflective electrode stacked on the semiconductor layer and having an Ag layer for reflecting light emitted from the active layer, toward the substrate; a p-side pad electrode stacked on the reflective electrode; an insulating film covering a side surface of the semiconductor layer and having light transmittance; and a reflective film stacked on the insulating film and having light reflectivity.

According to the first preferred embodiment, since the reflective film through which an electrode surface of the p-side pad electrode is exposed and which covers the side surface of the semiconductor layer is provided on the insulating film, light emitted from the active layer toward the side surface of the semiconductor layer can be reflected toward the substrate. In addition, since the reflective electrode is stacked on the semiconductor layer, light toward the p-side pad electrode can be further reflected toward the substrate. Thus, light emitted from the active layer in a direction opposite to a direction toward the substrate can be reflected toward the substrate. Consequently, light extraction efficiency can be further improved.

A second preferred embodiment is directed to the light emitting element of the first preferred embodiment, in which the p-side pad electrode and the reflective film are integrally formed.

According to the second preferred embodiment, since the reflective film and the p-side pad electrode are integrally formed, the reflective film and the p-side pad electrode can be formed at a single step.

A third preferred embodiment is directed to the light emitting element of the second preferred embodiment, in which the reflective film includes an inner reflective film made of migration-resistant metal having reflectivity, and an outer bonding film which is an Au layer.

According to the third embodiment, since the inner reflective film is made of metal more resistant to migration than metal forming the reflective electrode, the reflectivity can be ensured while preventing occurrence of migration. In addition, since the outer bonding film is the Au layer, the outer bonding film can function as the electrode surface of the p-side pad electrode while functioning as a protective film for protecting the inner reflective film from corrosion.

A fourth preferred embodiment is directed to the light emitting element of any one of the first to third preferred embodiments, in which a stepped portion is formed in at least part of a circumferential edge portion of the substrate, which is positioned outside the side surface of the semiconductor layer, and the insulating film and the reflective film are formed so as to extend from the stepped portion to the p-side pad electrode in a thickness direction of the substrate.

According to the fourth preferred embodiment, the stepped portion is formed in part or the entirety of the circumferential edge portion of the substrate, i.e., part of the substrate outside the side surface of the semiconductor layer. Thus, the reflective film provided on the stepped portion can cover a larger area of the active layer, thereby further enhancing the light extraction efficiency.

A fifth preferred embodiment is directed to the light emitting element of the fourth preferred embodiment, in which an n-side electrode is provided on the substrate on the same side as a side on which the p-side pad electrode is provided, the substrate is a conductive substrate, and the n-side electrode is provided on the stepped portion formed in the conductive substrate.

According to the fifth preferred embodiment, the n-side electrode is provided on the substrate on the same side as the side on which the p-side pad electrode is provided, thereby forming a flip-chip light emitting element.

A sixth preferred embodiment is directed to the light emitting element of the fourth preferred embodiment, in which an n-side electrode is provided on the substrate on the same side as a side on which the p-side pad electrode is provided, and the stepped portion is provided in a circumferential region of the substrate other than an n-side electrode formation region.

According to the sixth preferred embodiment, the n-side electrode is provided on the substrate on the same side as the side on which the p-side pad electrode is provided, thereby forming the flip-chip light emitting element. In addition, since the stepped portion is formed in the circumferential region of the substrate other than the n-side electrode formation region, the insulating film and the reflective film can be formed so as to have a large area even if the position (height) of an electrode surface of the n-side electrode is the same as the position (height) of a conventional light emitting element. Thus, the reflective film can cover a large area of the active layer, thereby maintaining bonding properties of the n-side electrode and further enhancing the light extraction efficiency.

A seventh preferred embodiment is directed to the light emitting element of any one of the first to third preferred embodiments, in which an n-side electrode is provided on a stepped portion which is an n-side electrode formation region formed by exposing part of the n-type layer, and the insulating film and the reflective film are formed so as to have a depth extending from the stepped portion to the p-side pad electrode.

According to the seventh preferred embodiment, since the n-side electrode is provided on the stepped portion formed in the n-side electrode formation region of the n-type layer, the reflective film in the n-side electrode formation region can be formed so as to a large area, thereby reflecting light emitted from the active layer within a broad range of area.

An eighth preferred embodiment is directed to the light emitting element of any one of the fifth to seventh preferred embodiments, in which the depth of each of the insulating film and the reflective film is greater in a circumferential region of the substrate, which is a region outside the side surface of the semiconductor layer other than the n-side electrode formation region, than in the n-side electrode formation region.

According to the eighth preferred embodiment, since the depth of each of the insulating film and the reflective film is greater in the circumferential region of the substrate, which is the region outside the side surface of the semiconductor layer other than the n-side electrode formation region, than in the n-side electrode formation region, the bonding properties of the n-side electrode can be maintained, and the light extraction efficiency can be further enhanced.

A ninth preferred embodiment is directed to the light emitting element of any one of the fifth to eighth preferred embodiments, in which the substrate is formed in a rectangular shape, and two n-side electrodes are provided in respective positions on a diagonal line of the substrate.

According to the ninth preferred embodiment, since the two n-side electrodes are provided in the respective positions on the diagonal line of the rectangular substrate, dispersibility of current flowing through the active layer can be improved.

A tenth preferred embodiment is directed to the light emitting element of any one of the fifth to eighth preferred embodiments, in which the substrate is formed in a rectangular shape, and four n-side electrodes are provided at respective four corners of the substrate.

According to the tenth preferred embodiment, since the four n-side electrodes are provided at the respective four corners of the rectangular substrate, the dispersibility of current flowing through the active layer can be further improved.

An eleventh preferred embodiment is directed to the light emitting element of any one of the first to fourth preferred embodiments, in which an n-side electrode is provided on a side of the substrate, which is opposite to a side on which the p-side pad electrode is provided.

According to the eleventh preferred embodiment, the light emitting element can be formed, in which the n-side electrode is provided on the side of the substrate, which is opposite to the side on which the p-side pad electrode is provided.

A twelfth preferred embodiment is directed to the light emitting element of any one of the first to eleventh preferred embodiments, in which the substrate is a gallium nitride substrate.

According to the twelfth preferred embodiment, since the substrate is the gallium nitride substrate, the light emitting element having a property in which the intensity of light from the reflective layer and the reflective electrode is higher at the center of the substrate can be formed.

A thirteenth preferred embodiment is directed to a light emitting device including the light emitting element of any one of the fifth to tenth preferred embodiments; and a sub-mount element formed by flip-chip mounting by which the light emitting element is mounted on an electrode provided on a mounting surface.

According to the thirteenth preferred embodiment, the flip-chip mounting is performed to mount the light emitting element of the fifth to tenth preferred embodiments on the sub-mount element, thereby forming the light emitting device having high light extraction efficiency.

First Embodiment

Figure 2:
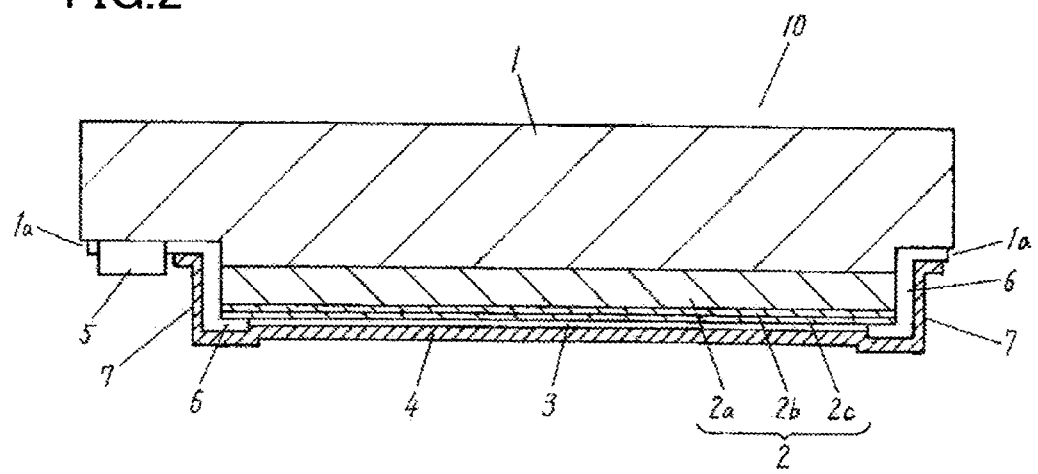
FIG. 2 is a cross-sectional view of the light emitting element illustrated in FIG. 1 along an A-A line.

A light emitting element of a first embodiment will be described with reference to drawings. FIG. 1 is a plan view illustrating the light emitting element of the first embodiment. FIG. 2 is a cross-sectional view of the light emitting element illustrated in FIG. 1 along an A-A line.

A light emitting element 10 illustrated in FIGS. 1 and 2 is a flip-chip light emitting element including a substrate 1, a semiconductor layer 2, a reflective electrode 3, a p-side pad electrode 4, an n-side electrode 5, an insulating film 6, and a reflective film 7.

The substrate 1 is a semiconductor substrate having light transmittance and conductivity. For example, a SiC substrate or a GaN substrate may be used as the substrate 1. A stepped portion 1a which is a recess relative to a surface of the semiconductor layer 2, at which the semiconductor layer 2 is stacked on the substrate 1, is formed in the substrate 1. The stepped portion 1a is formed in substantially a rectangular annular shape along a circumferential edge portion which is positioned outside a side surface of the semiconductor layer 2. The stepped portion 1a can be formed by etching both of part of the semiconductor layer 2 and part of the substrate 1 when the n-side electrode 5 is formed. In the first embodiment, the stepped portion 1a is formed in the substrate 1. However, as long as the stepped portion 1a is formed in a position deeper than an active layer 2b, the stepped portion 1a may be formed in an n-type layer 2a.

The semiconductor layer 2 includes the n-type layer 2a stacked on the substrate 1 with a buffer layer (not shown in the figure) being interposed between the substrate 1 and the n-type layer 2a, the active layer 2b stacked on the n-type layer 2a, and a p-type layer 2c stacked on the active layer 2b. The buffer layer may not be provided.

The n-type layer 2a is a semiconductor layer containing at least Ga and N. In addition, e.g., Si or Ge may be preferably used as n-type dopant added to the n-type layer 2a. The n-type layer 2a is formed so as to have a thickness of 2 μm.

The active layer 2b is directly stacked on the n-type layer 2a, or is stacked on the n-type layer 2a with a semiconductor layer containing at least Ga and N being interposed between the active layer 2b and the n-type layer 2a. The active layer 2b contains at least Ga and N and, if necessary, contains a proper amount of In, thereby obtaining a desired light emitting wavelength. Although the active layer 2b has a single-layer structure in the present embodiment, the active layer 2b may have, e.g., a multiple-quantum well structure having at least a pair of an InGaN layer and a GaN layer which are alternately stacked. The active layer 2b having the multiple-quantum well structure further improves brightness.

The p-type layer 2c is directly stacked on the active layer 2b, or is stacked on the active layer 2b with a semiconductor layer containing at least Ga and N being interposed between the p-type layer 2c and the active layer 2b. The p-type layer 2c is a semiconductor layer containing at least Ga and N. In addition, e.g., Mg may be preferably used as p-type dopant added to the p-type layer 2c. The p-type layer 2c is formed so as to have a thickness of 0.1 μm.

The reflective electrode 3 is an electrode provided on the p-type layer 2c, and functions as a reflective layer for reflecting light emitted from the active layer 2b and passing through the p-type layer 2c, in a direction toward the substrate 1. The reflective electrode 3 may be an Ag layer or an Rh layer. If the reflective electrode 3 is the Ag layer, the thickness of the reflective electrode 3 may fall within a range of 10 nm-2000 nm. The Ag layer may be formed of a plurality of layers containing Ag. On the other hand, if the reflective electrode 3 is the Rh layer, the thickness of the reflective electrode 3 may fall within a range of 10 nm-2000 nm.

The p-side pad electrode 4 is a bonding electrode including an Al layer or an Rh layer formed on the reflective electrode 3, and an Au layer positioned as the outermost layer.

The n-side electrode 5 is provided in an n-side electrode formation region, i.e., one corner portion of the stepped portion 1a of the substrate 1, which is recessed relative to the surface of the semiconductor layer 2, at which the semiconductor 2 is stacked on the substrate 1. The n-side electrode 5 is a bonding electrode including, e.g., a Ti layer or an Al layer formed on the substrate 1 and having good contactability, and an Au layer positioned as the outermost layer.

The insulating film 6 is a film having light transmittance and insulating properties. The insulating film 6 may be made of $SiO_2$. Since the insulating film 6 is formed so as to extend from the stepped portion 1a of the substrate 1 to the p-side pad electrode 4, an electrode surface of the p-side pad electrode 4 is exposed and the side surface of the semiconductor layer 2 is covered.

The reflective film 7 is a film stacked on the insulating film 6 and having reflectivity. Since the reflective film 7 is stacked on the insulating film 6 and is formed so as to extend from the stepped portion 1a of the substrate 1 to the p-side pad electrode 4, the reflective film 7 covers the side surface of the semiconductor layer 2. The reflective film 7 includes two films which are an inner reflective film and an outer reflective film stacked in this order from a side closer to the insulating film 6. The inner reflective film may be an Al layer or an Rh layer, and the outer reflective film may be an Au layer. In order to prevent mixing of the inner reflective film and the outer reflective film at an interface therebetween, any one of a Ti layer, a Pt layer, a Mo layer, or a Cr layer, or a combined layer thereof may be formed between the inner reflective film and the outer reflective film.

The semiconductor layer 2 and the reflective electrode 3 are stacked on the substrate 1, and the insulating film 6 is formed. Then, the reflective film 7 is formed by a liftoff technique, thereby stacking the reflective film 7 on the insulating film 6 and forming a thin film made of the same material as that of the reflective film 7 on the reflective electrode 3. The thin film is formed into the p-side pad electrode 4, and therefore the reflective film 7 and the p-side pad electrode 4 can be integrally and simultaneously formed. Since the insulating film 6, the reflective film 7, and the p-side pad electrode 4 are integrally formed, the insulating film 6 and the reflective film 7 are formed in substantially a bowl shape covering the semiconductor layer 2 and the reflective electrode 3. Note that a state in which the reflective film 7 and the p-side pad electrode 4 are integrally formed indicates that the reflective film 7 and the p-side pad electrode 4 are simultaneously made of the same material. In other words, the reflective film 7 and the p-side pad electrode 4 are continuously formed as a single component without any boundaries.

The light emitting element 10 of the first embodiment configured as described above allows the Al layer or the Rh layer of the reflective film 7 to reflect light which is emitted from the active layer 2b toward the side surface of the semiconductor layer 2 and light which is returned after being reflected by a back surface of the substrate 1, back toward the substrate 1. In addition, the reflective electrode 3 including the Ag layer having high reflectivity is stacked on the semiconductor layer 2, thereby further reflecting light emitted toward the p-side pad electrode 4, toward the substrate 1. Thus, light emitted from the active layer 2b in a direction opposite to a direction toward the substrate 1 can be reflected toward the substrate 1 by the reflective film 7 and the reflective electrode 3, thereby further improving light extraction efficiency. The p-side pad electrode 4 is stacked on the reflective electrode 3, and the insulating film 6 is provided on the side surface of the semiconductor layer 2. Thus, even if the reflective electrode 3 is the electrode including the Ag layer, occurrence of migration can be reduced.

The stepped portion 1a is formed in the substrate 1 of the light emitting element 10 of the first embodiment, but may not be provided. In such a case, the n-side electrode 5 may be provided on a stepped portion of a formation region where the n-side electrode 5 is provided, and the stepped portion may be formed by exposing part of the n-type layer 2a. However, since the stepped portion 1a is provided in the substrate 1, the reflective film 7 can be formed so as to extend from the stepped portion 1a to the p-side pad electrode 4 and can cover the entirety of the side surface of the semiconductor layer 2. Thus, light spreading toward the substrate 1 beyond the side surface of the semiconductor layer 2 can be reflected by the reflective film 7 provided on the stepped portion 1a. Since the substrate 1 is a gallium nitride substrate, the stepped portion 1a can be easily formed.

Since the Al layer or the Rh layer of the reflective film 7 is made of migration-resistant metal, the reflectivity can be ensured while preventing a short circuit between the p-side pad electrode 4 and the n-side electrode 5 due to the migration.

Since the reflective film 7 has the structure in which the Al layer or the Rh layer which is the inner reflective film is covered by the Au layer which is the outer reflective layer, the reflective film 7 can function as the electrode surface of the p-side pad electrode 4, and the Au layer can function as a protective film for protecting the Al layer or the Rh layer from corrosion.

The substrate 1 may be an insulating substrate such as a sapphire substrate. In such a case, the n-side electrode 5 is not provided on the sapphire substrate, but is provided on the n-type layer 2a exposed by etching.

Second Embodiment

Figure 3:
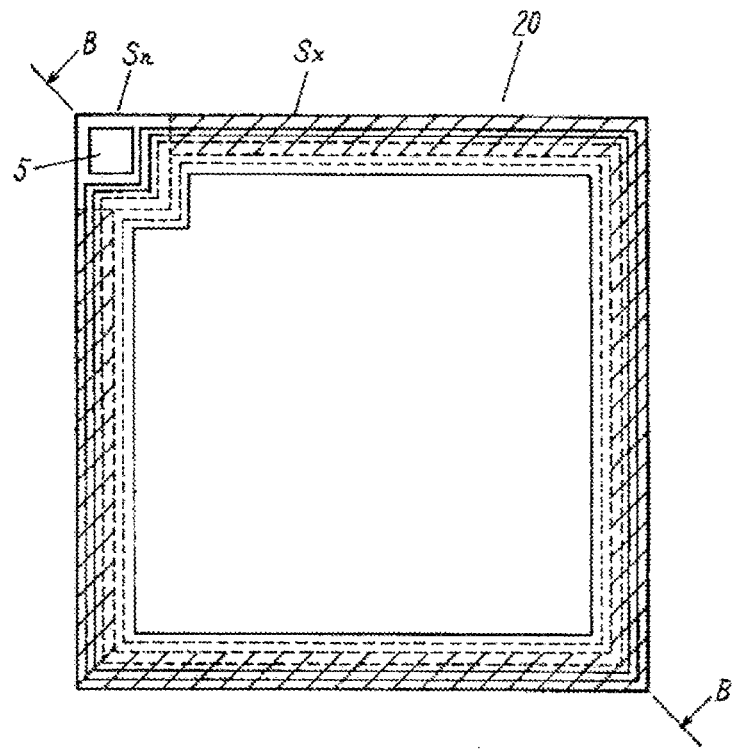
FIG. 3 is a plan view illustrating a light emitting element of a second embodiment of the present invention.
Figure 4:
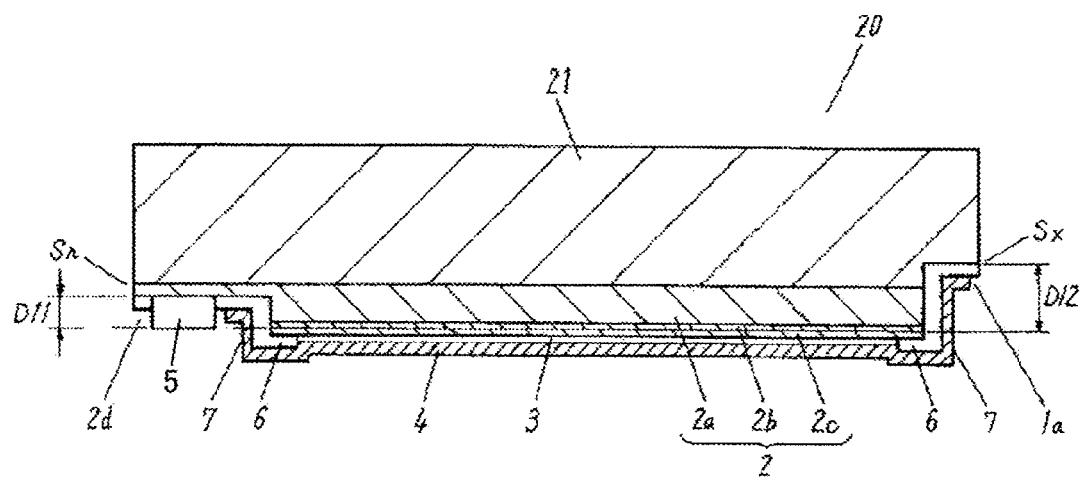
FIG. 4 is a cross-sectional view of the light emitting element illustrated in FIG. 3 along a B-B line.
Figure 5:
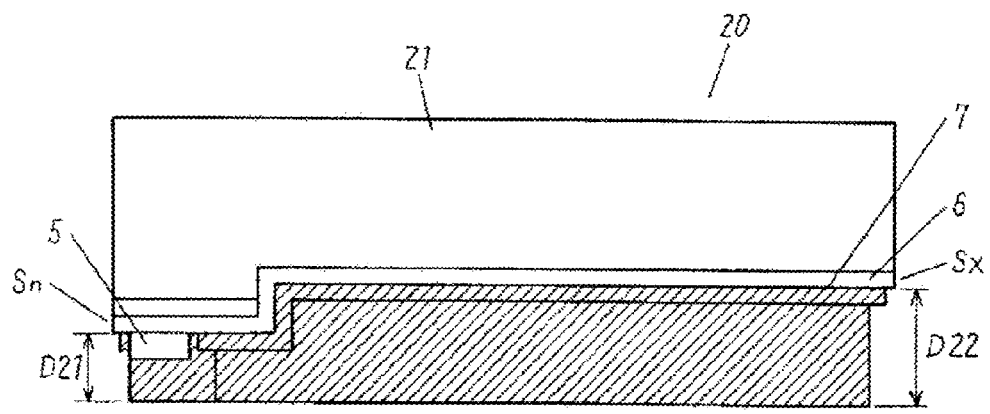
FIG. 5 is a side view of the light emitting element illustrated in FIG. 3.

A light emitting element of a second embodiment will be described with reference to drawings. FIG. 3 is a plan view illustrating the light emitting element of the second embodiment. FIG. 4 is a cross-sectional view of the light emitting device illustrated in FIG. 3 along a B-B line. FIG. 5 is a side view of the light emitting element illustrated in FIG. 3. Note that the same reference numerals as those shown in the light emitting element of the first embodiment are used to represent equivalent elements in FIGS. 3-5, and the description thereof will not be repeated.

In a light emitting element 20 illustrated in FIGS. 3 and 4, an insulating film 6 and a reflective film 7 formed in substantially a bowl shape so as to cover a semiconductor layer 2 and a reflective electrode 3 are configured such that the length in a thickness direction of a substrate 21 is longer in a circumferential region Sx (a shaded region in FIG. 3) of the substrate 21 other than an n-side electrode formation region Sn where an n-side electrode 5 is provided, than in the n-side electrode formation region Sn.

The n-side electrode formation region Sn is substantially a square region formed by, after the semiconductor layer 2 and the reflective electrode 3 are stacked on the substrate 21, performing dry etching of part of an n-type layer 2a, a p-type layer 2c, and an active layer 2b in such a region to expose a surface of the n-type layer 2a. The n-side electrode 5 of the light emitting element 20 is provided in the n-side electrode formation region Sn.

The circumferential region Sx is a region of a circumferential edge portion which is positioned outside a side surface of the semiconductor layer 2, other than the n-side electrode formation region Sn. The circumferential region Sx is formed by, after performing dry etching of the entirety of the circumferential edge portion including the n-side electrode formation region Sn, further performing dry etching to recess the circumferential region other than the n-side electrode formation region Sn until the substrate 21 is exposed.

By forming the substrate 21 as described above, a depth D12 from the active layer 2b to the circumferential region Sx other than the n-side electrode formation region Sn is greater than a depth D11 from the active layer 2b to the n-side electrode formation region Sn. The "depth" means the length or the distance in the thickness direction of the substrate 21.

Thus, a depth D21 of the insulating film 6 and the reflective film 7 in the n-side electrode formation region Sn is greater than a depth D22 of the insulating film 6 and the reflective film 7 in the circumferential region Sx other than the n-side electrode formation region Sn as illustrated in FIG. 5. Thus, the position of an electrode surface of the n-side electrode 5 can be the same as that of a conventional light emitting element, and a coverage area of the side surface of the semiconductor layer 2 by the insulating film 6 and the reflective film 7 can be increased without changing the thickness of the semiconductor layer 2 or the reflective electrode 3.

That is, since the position of the electrode surface of the n-side electrode 5 is the same as that of the conventional light emitting element, the distance to a mounting surface upon flip-chip mounting is substantially the same or the same as that of the conventional light emitting element. Thus, there is no difference in bonding properties when a light emitting element is mounted on a substrate with bumps being interposed therebetween. In addition, since the insulating film 6 and the reflective film 7 can be formed so as to have the large area in the circumferential region Sx, light from the active layer 2b can be reflected within a broad range of area.

Thus, in the light emitting element 20, bonding properties of the n-side electrode 5 can be maintained while further enhancing light extraction efficiency.

In the light emitting element 20 of the second embodiment, the n-side electrode formation region Sn is positioned corresponding to a stepped portion 2d of the n-type layer 2a, and the region Sx other than the n-side electrode formation region Sn is positioned corresponding to a stepped portion 1a of the substrate 21. However, as long as the sufficient depth of the reflective film 7 in the circumferential region Sx can be ensured as compared to the depth of the reflective film 7 in the n-side electrode formation region Sn, the stepped portion 1a of the substrate 21 may not be provided, and the region Sx may be positioned in the n-type layer 2a.

First Variation of Second Embodiment

Figure 6:
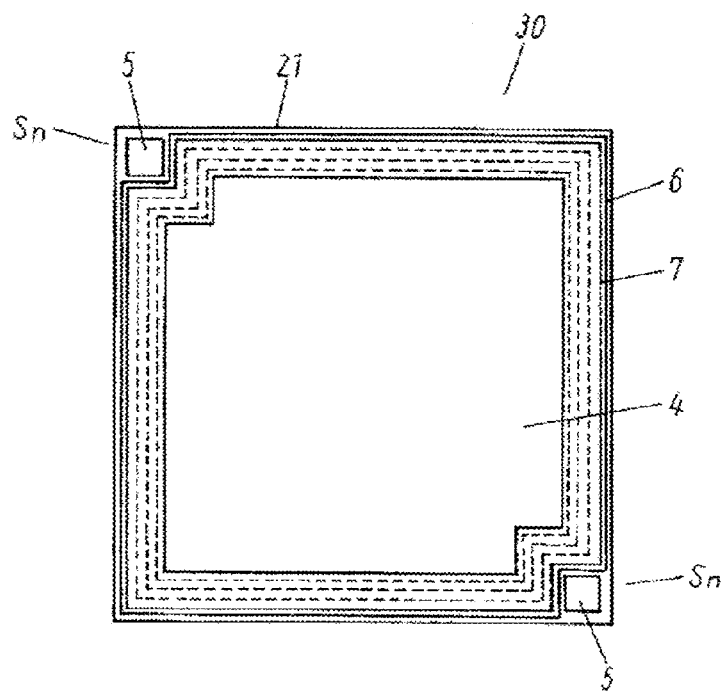
FIG. 6 is a plan view illustrating a first variation of the light emitting element of the second embodiment of the present invention.

A first variation of the light emitting element of the second embodiment will be described with reference to a drawing. FIG. 6 is a plan view illustrating the first variation of the light emitting element of the second embodiment.

In the first variation of the light emitting element of the second embodiment as illustrated in FIG. 6, a light emitting element 30 is configured such that two n-side electrode formation regions Sn are provided in respective positions on a diagonal line of a rectangular substrate 21, and the n-side electrode 5 is provided in each of the n-side electrode formation regions Sn.

Because of arrangement of the n-side electrodes 5 on the substrate 21 as described above, current from an n-type layer 2a spreads and flows into the two n-side electrodes 5. Thus, light extraction efficiency can be improved while improving dispersibility of current flowing through an active layer 2b.

Second Variation of Second Embodiment

Figure 7:
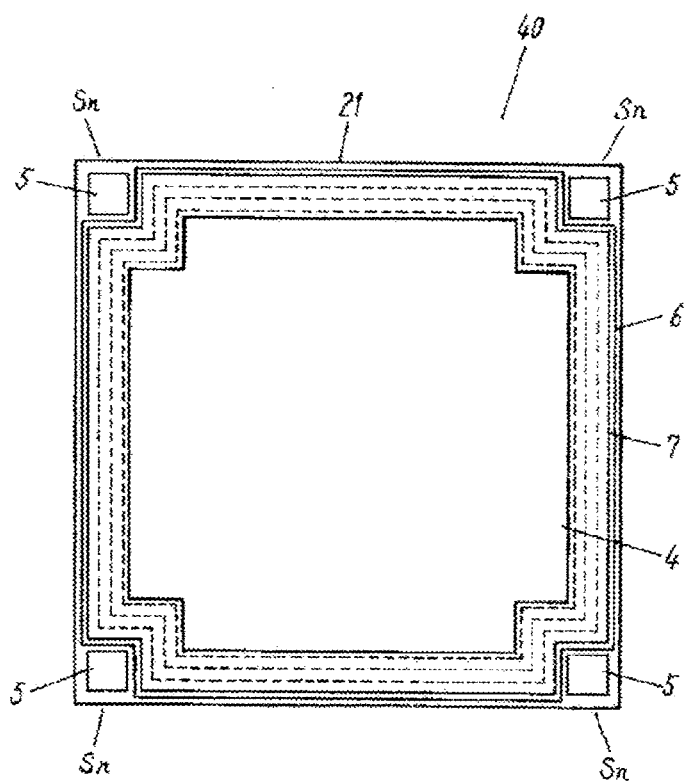
FIG. 7 is a plan view illustrating a second variation of the light emitting element of the second embodiment of the present invention.

A second variation of the light emitting element of the second embodiment will be described with reference to a drawing. FIG. 7 is a plan view illustrating the second variation of the light emitting element of the second embodiment.

In the second variation of the light emitting element of the second embodiment as illustrated in FIG. 7, a light emitting element 40 is configured such that four n-side electrode formation regions Sn are provided at respective four corners of a rectangular substrate 21, and the n-side electrode 5 is provided in each of the n-side electrode formation regions Sn.

Because of arrangement of the n-side electrodes 5 as described above, current from an n-type layer 2a spreads and flows into the four n-side electrodes 5. Thus, light extraction efficiency can be improved while further improving dispersibility of current flowing through an active layer 2b.

Third Embodiment

Figure 8:
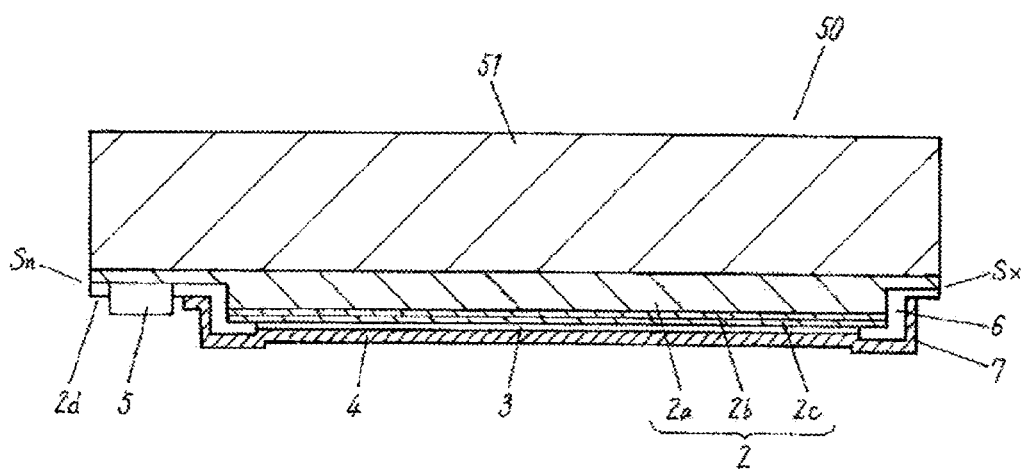
FIG. 8 is a cross-sectional view of a light emitting element of a third embodiment of the present invention.

A light emitting element of a third embodiment will be described with reference to a drawing. FIG. 8 is a cross-sectional view of the light emitting element of the third embodiment. Note that the same reference numerals as those shown in the light emitting elements of the first and second embodiments are used to represent equivalent elements in FIG. 8, and the description thereof will not be repeated.

In a light emitting element 50 of the third embodiment as illustrated in FIG. 8, a stepped portion 2d is provided by removing part of a circumferential edge portion of a semiconductor layer 2 in a thickness direction thereof. An n-side electrode formation region Sn provided at one corner of the circumferential edge portion of the semiconductor layer 2, and a circumferential region Sx other than the n-side electrode formation region Sn are provided corresponding to the stepped portion 2d. In addition, the n-side electrode 5, an insulating film 6, and a reflective film 7 are provided on the stepped portion 2d.

The stepped portion 2d is a rectangular circular notch formed by, after the semiconductor layer 2 is stacked on a substrate 51, performing dry etching of part of an n-type layer 2a, a p-type layer 2c, and an active layer 2b in the circumferential edge portion to expose a surface of the n-type layer 2a.

The n-side electrode formation region Sn is substantially a square region formed in one corner portion of the surface of the n-type layer 2a exposed upon the formation of the stepped portion 2d, and the n-side electrode 5 of the light emitting element 50 is provided in the n-side electrode formation region Sn.

The insulating film 6 and the reflective film 7 are formed so as to cover the entirety of a side surface of the semiconductor layer 2 exposed by the etching and to have a depth extending from the stepped portion 2d to a p-side pad electrode 4.

The light emitting element 50 allows a reflective electrode 3 and the reflective film 7 to reflect light which is emitted from the active layer 2b toward the side surface of the semiconductor layer 2 and light which is returned after being reflected by a back surface of the substrate 51, back toward the substrate 51. Thus, in the light emitting element 50, light extraction efficiency can be improved.

Fourth Embodiment

Figure 9:
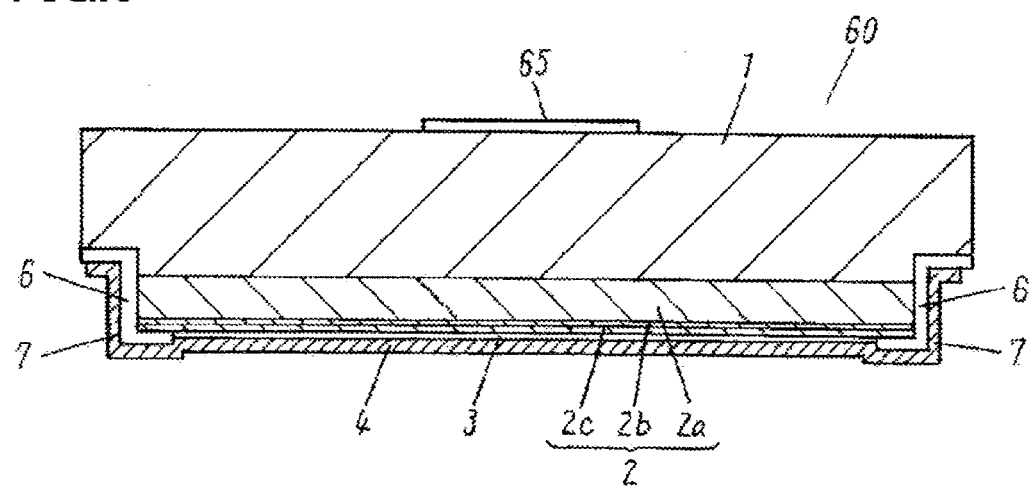
FIG. 9 is a cross-sectional view of a light emitting element of a fourth embodiment of the present invention.

A light emitting element of a fourth embodiment will be described with reference to a drawing. FIG. 9 is a cross-sectional view of a light emitting element 60 of the fourth embodiment. Note that the same reference numerals as those shown in each of the first to third embodiments are used to represent equivalent elements in FIG. 9, and the description thereof will not be repeated.

In the light emitting element 60 of the fourth embodiment as illustrated in FIG. 9, an n-side bonding electrode 65 to be wire-bonded to a substrate 1 is provided on a side (principal light emitting surface side) of the substrate 1, which is opposite to a side on which a p-side pad electrode 4 is provided. The light emitting element 60 is the same as the light emitting element 10 of the first embodiment, except that the n-side bonding electrode 65 is provided on the side of the substrate 1, which is opposite to the side on which the p-side pad electrode 4 is provided.

In the light emitting element 60 in which the n-side bonding electrode 65 is provided on a top surface of the substrate 1, a reflective electrode 3 and a reflective film 7 are provided, and therefore light emitted from an active layer 2b in a direction opposite to a direction toward the substrate 1 can be reflected toward the substrate 1. In addition, light which is, after irradiation of a mounting surface of the substrate 1 on which the n-side bonding electrode 65 is mounted, reflected by the mounting surface can be reflected back toward the substrate 1 by the reflective electrode 3 and the reflective film 7. Thus, in the light emitting element 60, light extraction efficiency can be improved.

Fifth Embodiment

Figure 10:
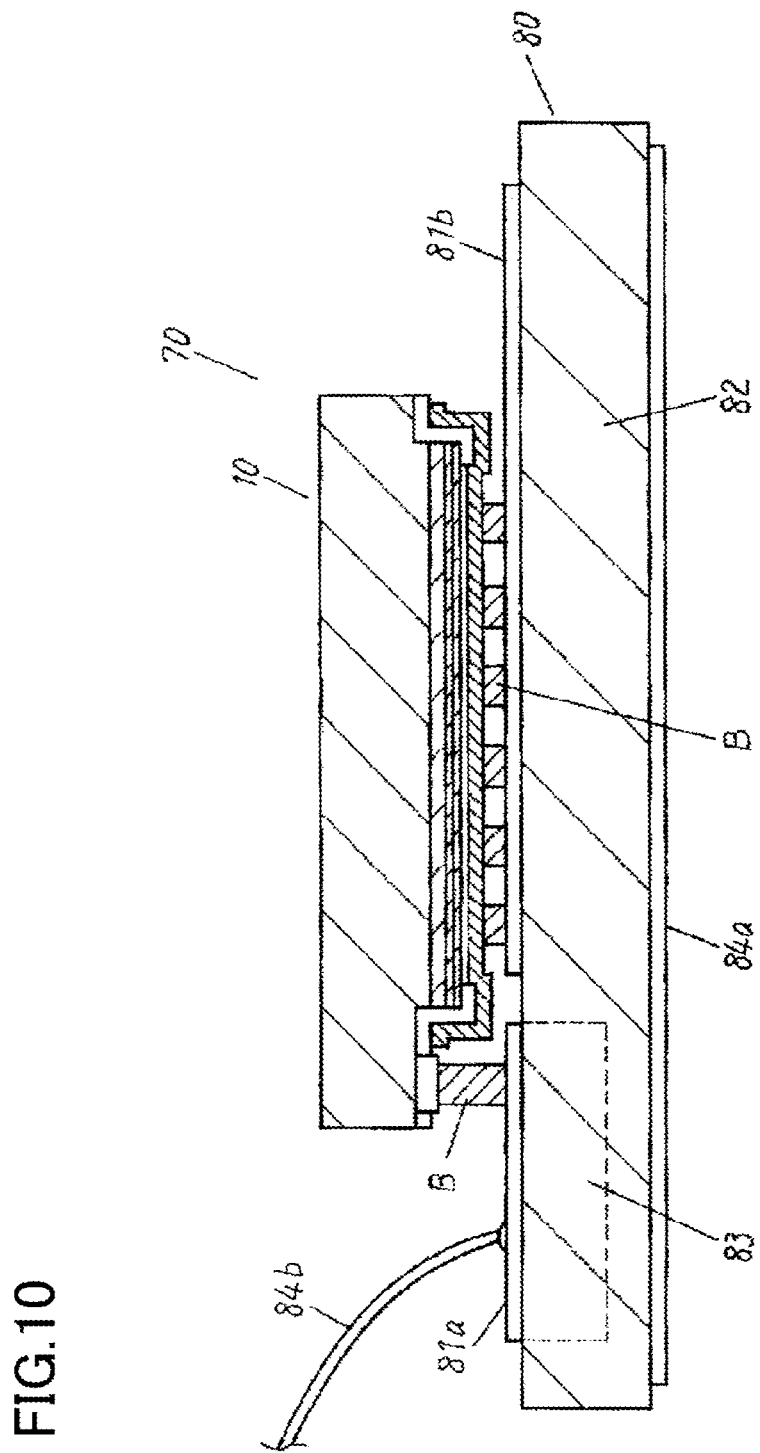
FIG. 10 is a cross-sectional view illustrating a light emitting device of a fifth embodiment of the present invention.
Figure 11:
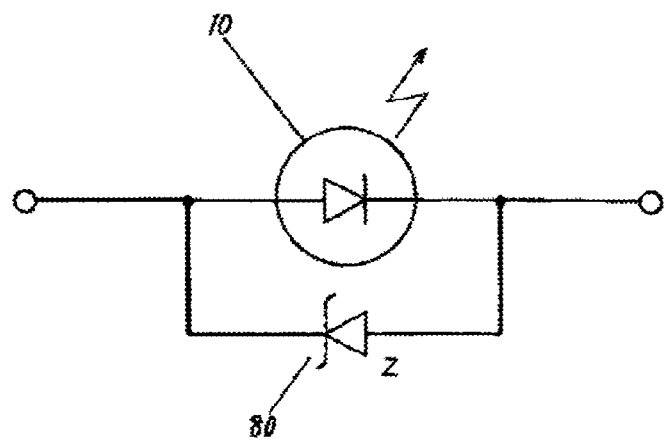
FIG. 11 is a circuit diagram of the light emitting device illustrated in FIG. 10.

A light emitting device of a fifth embodiment will be described with reference to drawings. FIG. 10 is a cross-sectional view illustrating a light emitting device 70 of the fifth embodiment. FIG. 11 is a circuit diagram of the light emitting device 70 illustrated in FIG. 10.

The light emitting device 70 of the fifth embodiment is a composition device formed by flip-chip mounting by which the light emitting element 10 of the first embodiment is mounted on mounting-surface electrodes 81a and 81b provided on a mounting surface of a submount element 80 functioning as a zener diode, with a bump B being interposed between the light emitting element 10 and each of the mounting-surface electrodes 81a and 81b.

A p-type semiconductor region 83 is provided in part of an n-type silicon substrate 82 so that excessive voltage is not applied to the light emitting element 10, and therefore the submount element 80 functions as the zener diode. Power is supplied to the submount element 80 through a bottom-surface electrode 84a provided on a bottom surface of the submount element 80 and a wire 84b. The circuit diagram in a state in which the light emitting element 10 is mounted on the submount element 80 is illustrated in FIG. 11. In the fifth embodiment, the submount element 80 is a zener diode Z, but may be a diode, a capacitor, a resistor, a varistor, or a printed circuit board in which a wiring pattern is formed in an insulating substrate made of aluminum nitride.

Since the flip-chip mounting is performed to mount the light emitting element 10 on the submount element 80, the light emitting device 70 having high light extraction efficiency can be produced.

EXAMPLE

As an example, a gallium nitride compound semiconductor light emitting element illustrated in FIGS. 1 and 2 was formed. In the present example, organic metal vapor phase epitaxy was used as a method for growing a gallium nitride compound semiconductor. However, the present invention is not limited to the foregoing, and, e.g., molecular beam epitaxy or organic metal molecular beam epitaxy may be used.

First, a GaN substrate 1 having a mirror-finished surface was arranged on a substrate holder of a reaction tube. Then, the temperature of the substrate 1 was maintained at 1050° C., and the substrate 1 was heated for 5 minutes while nitrogen, hydrogen, and ammonia were supplied. In such a manner, moisture and dirt such as organic substances adhered to a surface of the substrate 1 were removed.

Next, while nitrogen and hydrogen were supplied as carrier gas, ammonia, TMG, and $SiH_4$ were supplied. Then, a Si-doped n-type layer 2a made of GaN was grown to a thickness of 2 μm.

After the growth of the n-type layer 2a, the supply of TMG and $SiH_4$ was stopped, and the substrate temperature was dropped to 750° C. At 750° C., while nitrogen was supplied as carrier gas, ammonia, TMG, and trimethylindium (hereinafter abbreviated as "TMI") were supplied. Then, an undoped active layer 2b made of InGaN and having a single quantum well structure was grown to a thickness of 2 nm.

After the growth of the active layer 2b, the supply of TMI was stopped. While TMG was supplied, the substrate temperature was increased to 1050° C. During the increase in substrate temperature, an undoped GaN film (not shown in the figure) was grown to a thickness of 4 nm. At the substrate temperature of 1050° C., while nitrogen and hydrogen were supplied as carrier gas, ammonia, TMG, trimethylaluminium (hereinafter abbreviated as "TMA"), and cyclopentadienyl magnesium (hereinafter abbreviated as "$Cp_2Mg$") were supplied. Then, a Mg-doped p-type layer 2c made of AlGaN was grown to a thickness of 0.05 μm.

After the growth of the p-type layer 2c, the supply of TMG, TMA, and $Cp_2MG$ was stopped. Then, while nitrogen gas and ammonia were supplied, the temperature of the substrate 1 was substantially dropped to a room temperature. Subsequently, a wafer in which a gallium nitride compound semiconductor is stacked on the substrate 1 was removed from the reaction tube.

A $SiO_2$ film was stacked on a surface of a multi-layer structure including the gallium nitride compound semiconductor formed in the foregoing manner, by CVD without separately performing annealing. Then, photolithography and wet etching were performed to pattern the $SiO_2$ film into substantially a square shape, thereby forming a $SiO_2$ mask for etching. Part of the p-type layer 2c, part of the active layer 2b, and part of the n-type layer 2a were removed in a direction opposite to a layer stacking direction by reactive ion etching until the depth reaches about 3 thereby exposing the surface of the substrate 1.

After the $SiO_2$ mask for etching was removed by the wet etching, a $SiO_2$ film was re-stacked, and a photoresist was applied to the surface of the multi-layer structure. The photoresist and the $SiO_2$ film on a surface of the p-type layer 2c were removed by the photolithography, thereby exposing 80% or more of a surface of the $SiO_2$ film on a p-type contact layer. Then, the wet etching was performed for the exposed $SiO_2$ film, thereby exposing the p-type layer 2c.

The multi-layer structure was arranged in a chamber of a vacuum deposition apparatus. After the chamber was evacuated to equal to or less than $2 \times 10^{-6}$ Torr, an Ni layer having a thickness of 0.3 nm was deposited on the exposed surface of the p-type layer 2c and the photoresist by electron beam deposition.

Subsequently, an Ag layer having a thickness of 100 nm was deposited as a reflective electrode 3, and a Cr layer having a thickness of 30 nm was further deposited on the Ag layer.

Next, after the multi-layer structure was removed from the chamber, a Pt layer, the Ag layer, and the Cr layer on the photoresist were removed together with the photoresist, thereby forming the reflective electrode 3 in which the Pt layer, the Ag layer, and the Cr layer are stacked in this order on the surface of the p-type layer 2c. In such a manner, the reflective electrode 3 could be stacked without occurrence of peeling off of the Ag layer.

A photoresist was re-applied to the surface of the multi-layer structure, and only the exposed photoresist on the $SiO_2$ film and the reflective electrode 3 was removed by the photolithography, thereby exposing the $SiO_2$ film and the reflective electrode 3.

Next, the multi-layer structure was arranged in the chamber of the vacuum deposition apparatus. After the chamber was evacuated to equal to or less than $2 \times 10^{-6}$ Torr, an Al layer (250 nm), a Ti layer (100 nm), and an Au layer having a thickness of 1.3 μm were deposited on exposed surfaces of the $SiO_2$ film and the reflective electrode 3 by the electron beam deposition.

Next, the multi-layer structure was removed from the chamber. Then, part of the Al layer, part of the Ti layer, and part of the Au layer on the photoresist were removed together with the photoresist, thereby forming a reflective layer 7 in which the Al layer, the Ti layer, and the Au layer are stacked in this order on the $SiO_2$ film formed as an insulating film 6 and the reflective electrode 3.

A photoresist was re-applied to the surface of the multi-layer structure, and the exposed photoresist and the exposed $SiO_2$ film on the n-type layer 2a were removed by the photolithography. In such a manner, the n-type layer 2a was exposed.

Next, the multi-layer structure was arranged in the chamber of the vacuum deposition apparatus. After the chamber was evacuated to equal to or less than $2 \times 10^{-6}$ Torr, an Al layer (250 nm), a Ti layer (100 nm), and an Au layer having a thickness of 1.3 μm were deposited on the exposed surfaces of the $SiO_2$ film and the reflective electrode 3 and the photoresist by the electron beam deposition.

Next, the multi-layer structure was removed from the chamber. Then, the Al layer, the Ti layer, and the Au layer on the photoresist were removed together with the photoresist, thereby forming an n-side electrode 5 in which the Al layer, the Ti layer, and the Au layer are stacked in this order on the n-type layer 2a.

Subsequently, a back surface of the substrate 1 was polished so that the thickness of the substrate 1 can be adjusted to about 100 μm, and the substrate 1 was cut into chips by scribing. In the foregoing manner, a gallium nitride compound semiconductor light emitting element (light emitting element 10) illustrated in FIGS. 1 and 2 was produced.

Figure 12:
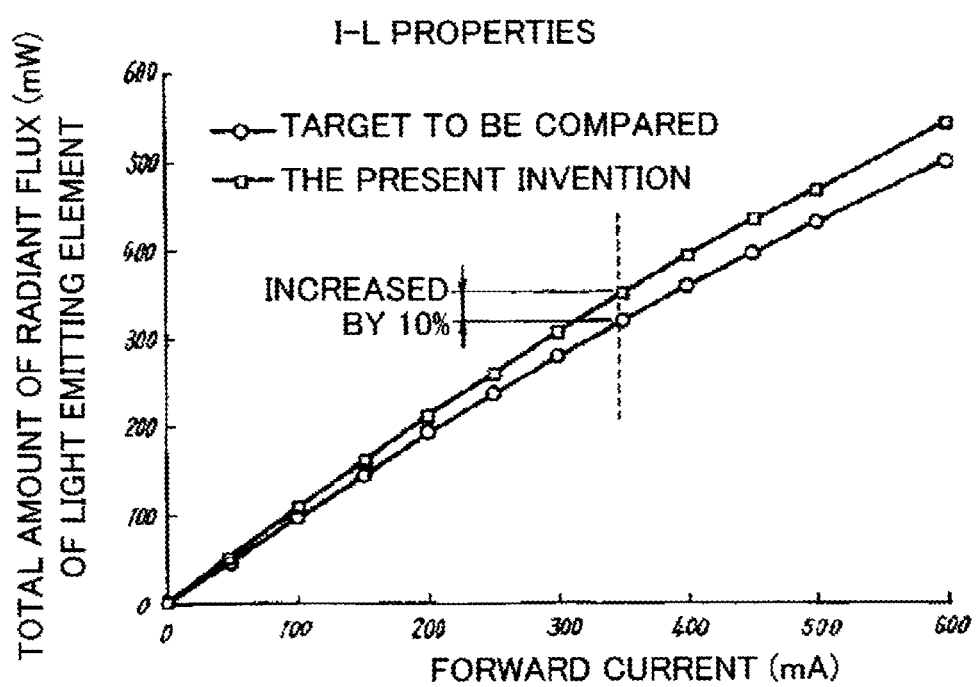
FIG. 12 is a graph illustrating I-L characteristics.
Figure 13:
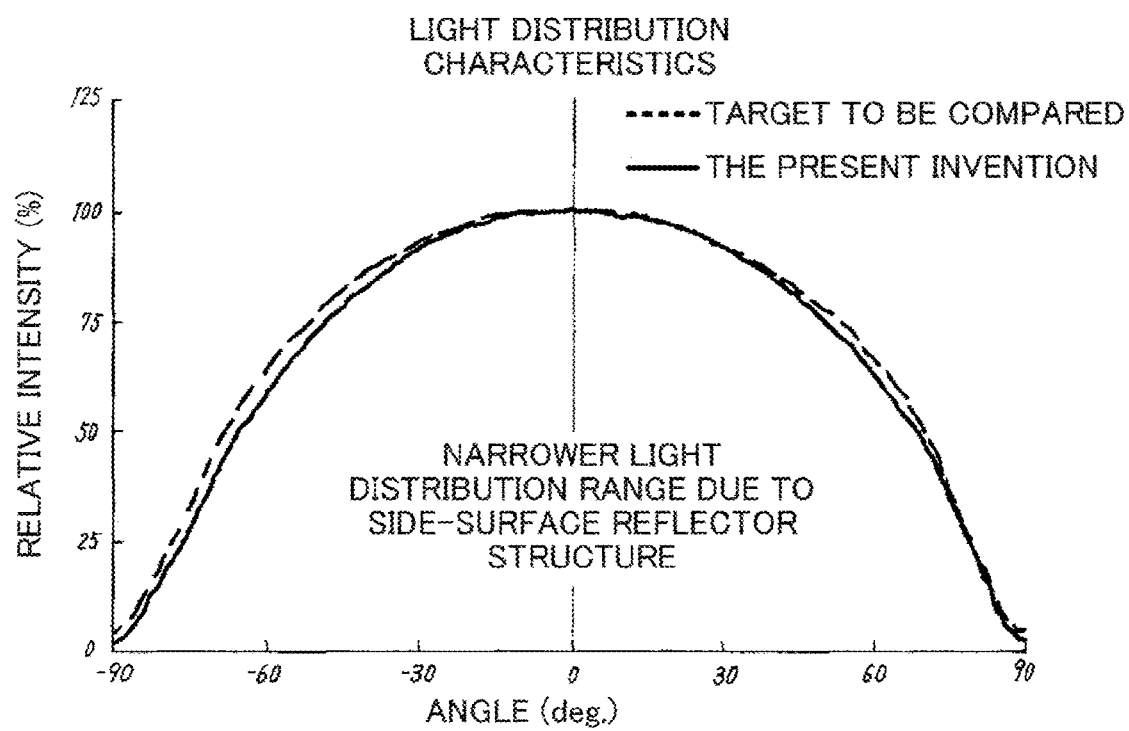
FIG. 13 is a graph illustrating light distribution characteristics.

In a state in which an electrode formation surface of the light emitting element 10 faces down, the light emitting element 10 was bonded onto a Si diode having a pair of positive and negative electrodes through Au bumps. In such a state, the light emitting element 10 was mounted such that the p-side pad electrode 4 and the n-side electrode 5 of the light emitting element are connected to the negative and positive electrodes of the Si diode, respectively. Subsequently, the Si diode on which the light emitting element is mounted was mounted on a stem with Ag paste, and the positive electrode of the Si diode was connected to an electrode provided on the stem, through a wire. Then, resin molding is performed, thereby producing a light emitting diode. When I-L characteristics of the light emitting diode were compared with those of a conventional light emitting element (target to be compared) in which an insulating film 6 and a reflective film 7 are not provided, brightness was improved by about 10% as illustrated in FIG. 12. In addition, for light distribution characteristics, the present invention (light emitting element 10) has a light distribution range narrower than that of the target to be compared as illustrated in FIG. 13. In addition, since the substrate 1 is the gallium nitride substrate, characteristics can be obtained, in which a light intensity is higher in a center portion of the substrate 1 and is gradually decreased toward the circumferential edge portion of the substrate 1.

INDUSTRIAL APPLICABILITY

In the present invention, the light extraction efficiency can be further enhanced. Thus, the present invention is suitable for, e.g., the flip-chip light emitting element in which the semiconductor layer including the n-type layer, the active layer, and the p-type layer is stacked on the substrate, and to the light emitting device.

DESCRIPTION OF REFERENCE CHARACTERS

1, 21, 51 Substrate
1a, 2d Stepped Portion
2 Semiconductor Layer
2a n-Type Layer
2b Active Layer
2c p-Type Layer
3 Reflective Electrode
4 p-Side Pad Electrode
5 n-Side Electrode
6 Insulating Film
7 Reflective Film
10, 20, 30, 40, 50, 60 Light Emitting Element
65 n-Side Bonding Electrode
70 Light Emitting Device
80 Submount Element
81a, 81b Mounting-Surface Electrode
82 n-Type Silicon Substrate
83 p-Type Semiconductor Region
84a Bottom-Surface Electrode
84b Wire
B Bump
Sn n-Side Electrode Formation Region
Sx Circumferential Region
Z Zener Diode

The invention claimed is:

1. A light emitting element, comprising:
   a substrate having light transmittance;
   a semiconductor layer in which an n-type layer, an active layer, and a p-type layer are stacked on the substrate;
   a reflective electrode stacked on the semiconductor layer and configured to reflect light emitted from the active layer, toward the substrate;
   a p-side pad electrode stacked on the reflective electrode;
   an insulating film covering a side surface of the semiconductor layer and having light transmittance; and
   a reflective film stacked on the insulating film and having light reflectivity, wherein:
   the p-side pad electrode and the reflective film are integrally formed,
   the reflective film covers the side surface of the semiconductor layer with the insulating film being interposed therebetween, and
   no insulating film is formed on an outer surface of the reflective film.

2. The light emitting element of claim 1, wherein
   the reflective film includes at least an inner reflective film made of metal more resistant to migration than metal forming the reflective electrode, and an outer bonding film which is an Au layer.

3. The light emitting element of claim 1, wherein
   a stepped portion is formed in at least part of a circumferential edge portion of the substrate, which is positioned outside the side surface of the semiconductor layer, and
   the insulating film and the reflective film are formed so as to extend from the stepped portion to the p-side pad electrode in a thickness direction of the substrate.

4. The light emitting element of claim 3, wherein
   an n-side electrode is provided on the substrate on a same side as a side on which the p-side pad electrode is provided,
   the substrate is a conductive substrate, and
   the n-side electrode is provided on the stepped portion formed in the conductive substrate.

5. The light emitting element of claim 4, wherein
   the substrate is formed in a rectangular shape, and
   two n-side electrodes are provided in respective positions on a diagonal line of the substrate.

6. The light emitting element of claim 4, wherein
   the substrate is formed in a rectangular shape, and
   four n-side electrodes are provided at respective four corners of the substrate.

7. The light emitting element of claim 3, wherein
   an n-side electrode is provided on the substrate on a same side as a side on which the p-side pad electrode is provided, and
   the stepped portion is provided in a circumferential region of the substrate other than an n-side electrode formation region.

8. The light emitting element of claim 1, wherein
   an n-side electrode is provided on a stepped portion which is an n-side electrode formation region formed by exposing part of the n-type layer, and
   the insulating film and the reflective film are formed so as to extend from the stepped portion to the p-side pad electrode in a thickness direction of the substrate.

9. The light emitting element of claim 8, wherein
   a length of each of the insulating film and the reflective film in the thickness direction of the substrate is longer in a circumferential region of the substrate, which is a region outside the side surface of the semiconductor layer other than the n-side electrode formation region, than in the n-side electrode formation region.

10. The light emitting element of claim 1, wherein an n-side electrode is provided on a side of the substrate, which is opposite to a side on which the p-side pad electrode is provided.

11. The light emitting element of claim 1, wherein the substrate is a gallium nitride substrate.

12. A light emitting device, comprising:
the light emitting element of claim 1; and
a submount element having a mounting surface and formed by flip-chip mounting by which the light emitting element is mounted on an electrode provided on the mounting surface.

* * * * *